United States Patent [19]

Annamalai

[11] Patent Number: 5,376,579
[45] Date of Patent: Dec. 27, 1994

[54] SCHEMES TO FORM SILICON-ON-DIAMOND STRUCTURE

[75] Inventor: Nagappan Annamalai, Nashua, N.H.

[73] Assignee: The United States of America as represented by the Secretary of the Air Force, Washington, D.C.

[21] Appl. No.: 87,191

[22] Filed: Jul. 2, 1993

[51] Int. Cl.$^5$ .................. H01L 21/70; H01L 31/0264
[52] U.S. Cl. ..................... 437/126; 148/333; 148/334; 437/62; 437/86; 437/974
[58] Field of Search ............... 156/613, 612; 148/33.3, 148/33.4, DIG. 135; 437/62, 86, 974, 126

[56] References Cited

U.S. PATENT DOCUMENTS

| | | | |
|---|---|---|---|
| 4,768,011 | 8/1988 | Hattori et al. | 338/5 |
| 4,863,529 | 9/1989 | Imai | 148/33.4 |
| 4,981,818 | 1/1991 | Anthony et al. | 437/233 |
| 5,122,509 | 6/1992 | Beetz, Jr. et al. | 505/1 |
| 5,131,963 | 7/1992 | Ravi | 148/33.3 |
| 5,155,559 | 10/1992 | Humphreys | 357/15 |
| 5,173,761 | 12/1992 | Dreifus | 257/22 |
| 5,186,785 | 2/1993 | Annamalai | 156/613 |
| 5,272,104 | 12/1993 | Schrantz et al. | 437/63 |

FOREIGN PATENT DOCUMENTS

| | | |
|---|---|---|
| 317124 | 5/1989 | European Pat. Off. . |
| 91-11822 | 8/1991 | WIPO . |

OTHER PUBLICATIONS

Wolf et al., "Silicon Processing for the VLSI Era", Lattice Press, Sunset Beach, Calif., pp. 23–25 (1986).

*Primary Examiner*—Olik Chaudhuri
*Assistant Examiner*—Ken Horton
*Attorney, Agent, or Firm*—William G. Auton; Jacob N. Erlich

[57] ABSTRACT

Processes to produce Silicon-On-Diamond (SOD) Structures. In one process, two epitaxial layers are grown on a seed silicon wafer. The first layer is an etch stop layer and the second layer is an undoped silicon layer. A CVD diamond is deposited on top of this substrate, and covered with a thin layer of polysilicon. This structure is now bonded to another silicon handle wafer. The seed silicon layer and the etch stop layer are removed by mechanical means and chemical etching. The substrate consists of a silicon substrate, a polysilicon layer, a diamond layer and an undoped silicon layer. In a second process a diamond layer is deposited onto a SIMOX Wafer and polysilicon is deposited upon the diamond layer. A silicon wafer is bonded to the polysilicon layer and the SIMOX wafer less the silicon overlayer on the buried oxide is removed by grinding and etching to obtain silicon-on-diamond structure. A third process described uses a thick polysilicon as a handle wafer instead of bonding a silicon wafer as in processes I and II and uses the approach of the two processes described above. In this process a non-edge rounded silicon wafer as a starting substrate.

5 Claims, 2 Drawing Sheets

SCHEMES TO FORM SILICON-ON-DIAMOND STRUCTURE

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to devices fabricated on thin silicon films, and more specifically the invention pertains a process for fabricating radiation-resistant silicon substrate devices grown on insulating diamond films.

Recently there has been increased interest in recrystallizing thin layers of semiconductor material, especially silicon, on a buried noncrystalline insulator layer as in, semiconductor-on-insulator technology. Typically, a layer of insulator material is formed on a semiconductor substrate and next, a layer of semiconductor material, is deposited thereover. The semiconductor layer is melted in whole or in part, and one or more solidification fronts are caused to advance laterally across the semiconductor layer.

Electronic devices based on buried insulator structures offer promise of, increased dielectric isolation, useful in, high voltage-high power devices, reduced parasitic capacitance in integrated circuits, and of improved radiation hardness of devices. Common buried insulator is silicon dioxide. While these devices have proven excellent, the search continues for radiation resistant silicon substrate devices, which could operate at high temperatures.

A promising buried insulator candidate is diamond. Diamond films have a resistivity of $10^{16}$ ohm-cm, and are excellent electrical insulators. The task of producing a recrystallized silicon layer on diamond device is alleviated, to some extent, by the systems disclosed in the following U.S. Patents, the disclosures of which are incorporated herein by reference.

U.S. Pat. No. 5,186,785 issued to Annamalai;
U.S. Pat. No. 5,155,559 issued to Humphreys et al;
U.S. Pat. No. 5,131,963 issued to Ravi; and
U.S. Pat. No. 5,122,509 issued to Beetz, Jr. et al.

The patents listed above, relate to silicon-on--diamond (SOD) structures and processes to produce SOD structures. In particular, the Annamalai patent describes a process for fabricating radiation resistant silicon substrate based devices of zone melted, recrystallized silicon on diamond insulator films. The process begins by growing a 0.5 micron thick or a suitable thickness diamond insulating film on a silicon wafer such that the wafer has an exposed outer rim which circumscribes the diamond film. Next, a polysilicon coating is deposited over the diamond so that the polysilicon coating contacts the rim of the silicon wafer. Exposure of the wafer to heat at temperatures of 1,400 degrees Centigrade recrystallizes the polysilicon coating into a single recrystallized silicon crystal. After the zone melted recrystallization treatment is administered, the rim of the silicon wafer is removed to complete the recrystallized silicon-on-diamond wafer.

The Humphreys et al. Patent is directed to a rectifying contact comprising a Semiconducting diamond layer for forming a rectifying contact therewith, and an annealed interface region between the semiconducting diamond layer and the refractory metal silicide layer. The invention also provides a method for making a rectifying contact on a semiconducting diamond layer comprising the steps of forming a refractory metal silicide on the semiconducting diamond layer, and annealing the refractory metal silicide and diamond layer. The step of annealing comprises the step of heating the diamond layer and refractory metal silicide to a temperature of up to 1100 degrees Centigrade.

The Ravi patent relates to semiconductor elements comprising a single crystal layer of silicon on a diamond insulator. A basic element is formed by diffusing into one surface of a substrate an etch stop material to form a diffusion prepared layer. A silicon layer is epitaxially deposited onto the diffusion prepared layer of the substrate. A diamond layer is deposited onto the epitaxial silicon layer, followed by a polysilicon layer of about 20 mils thick and the substrate is removed by an etching process. The diffusion prepared layer is then removed to retain the epi silicon layer on-diamond.

The Beetz, Jr. et al patent describes a multilayer superconducting thin film composite article, comprising a carbon-containing substrate, an interlayer, and an overlayer comprising an HTSC material. The carbon-containing substrate preferably comprises diamond, and the interlayer preferably comprises a zirconium carbide sub-layer of zirconium metal and an outer sub-layer of zirconium oxide at the interface with the HTSC material overlayer. The interlayer accommodates formation of the superconducting film in an environment at elevated temperature without destruction of the substrate, while at the same time protecting the HTSC material in the overlayer from deleterious reaction with the substrate which otherwise may cause the HTSC material or precursor thereof to be highly resistive. While the above-cited references are instructive, a need remains for processes for fabricating Silicon-On-Diamond structures. The present invention is intended to satisfy that need.

SUMMARY OF THE INVENTION

The present invention includes a process for fabricating radiation resistant silicon substrate based devices with Silicon-On-Diamond (SOD) Structures. In one embodiment, two epitaxial layers are grown on a seed silicon wafer. The first layer is an etch stop layer and the second layer is an undoped silicon layer. A CVD diamond is deposited on top of this substrate, and covered with a thin layer of polysilicon. This structure is now bonded to another silicon handle wafer. The seed silicon layer and the etch stop layer are removed by mechanical means and chemical etching. The substrate consists of a silicon substrate, a polysilicon layer, a diamond layer and an undoped silicon layer.

It is an object of the present invention to provide a silicon-on-diamond deposited silicon wafer that is radiation resistant.

It is another object of the present invention to make a semiconductor wafer that utilizes the thermal conductivity and high electrical insulation properties of thin diamond films.

These objects together with other objects, features, and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a process for fabricating a silicon substrate device which is grown on an electrically insulating diamond film.

Silicon-On-Diamond (SOD) is a form of Silicon-On-Insulator (SOI) technology. The Silicon-On-Diamond structure consists of a silicon substrate, a thin film of deposited diamond on top of the silicon substrate and an active silicon layer on top of the diamond film. Devices are fabricated in the active silicon layer. In SOD technology, diamond is used as an electrical insulator as compared with SOI, where silicon dioxide is used as an electrical insulator. The SOD structure having a high electrical resistivity and high thermal conductivity diamond film is suitable for developing high temperature, and a high speed ULSI circuits.

Figure 1:
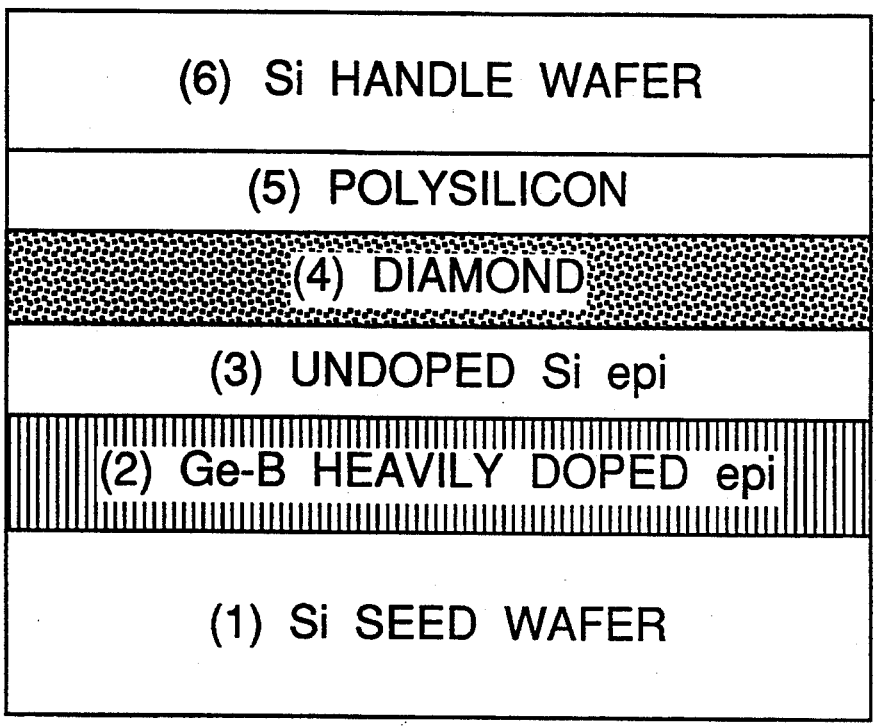
FIGS. 1-3 are views of the sequence of fabrication steps for the fabricating process of the present invention.

In the above-cited Annamalai patent is described a Zone Melting Recrystallized SOD structure. The present invention includes 3 different processes for making SOD structures. The reader's attention is now directed towards FIG. 1, which is a view of a sequence of seven fabrication steps for fabricating an SOD structure. In FIG. 1, in the first step, two epitaxial layers are grown on a seed silicon wafer 1: The first layer 2 is an etch stop layer with a heavy doping of B (Boron) and Ge (germanium) or any suitable etch stop layer, the second layer 3 is an undoped silicon layer of desired thickness to fabricate the desired devices such as MOSFETs or bipolar transistors.

In step two of the first process a diamond layer 4 is deposited on top of the undoped Si epi layer 3. This may be accomplished by chemical vapor deposition or any of the prior art techniques of the above-cited patents.

In step three of the first process, a thin polysilicon layer 5 is deposited on top of the diamond layer 4, as in the above-cited Annamalai patent.

In step four, a silicon handle wafer 6 is bonded on top of the polysilicon layer of step three.

In step five the seed silicon wafer 1 (introduced in step one) is removed using either mechanical means, or chemical etchings, or a combination of both. The mechanical means used in this step can include grinding, sanding or even sand blasting with ice particles as described in the patent of Mark Levi, U.S. Pat. No. 5,009,240 the disclosure of which is incorporated herein by reference.

In step six of the first process the doped Ge/B etch stop layer 2 is removed by chemical etching. The substrate turned around now consists of a silicon substrate 6, a polysilicon layer 5, a diamond layer 4 and an undoped silicon layer 3. The devices can be fabricated in the undoped silicon layer. This SOD structure now has a buried diamond layer with silicon on either side. The silicon substrate can be of any diameter. When the bonding technology becomes mature enough to bond diamond to silicon the polysilicon layer 5 is not necessary, and can be omitted.

Note that the two remaining steps (steps 5 and 6) of the process can be replaced as a single combined removing step. Other rearrangements of the process are similarly possible, such as breaking up step one into two separate growing steps.

Figure 2:
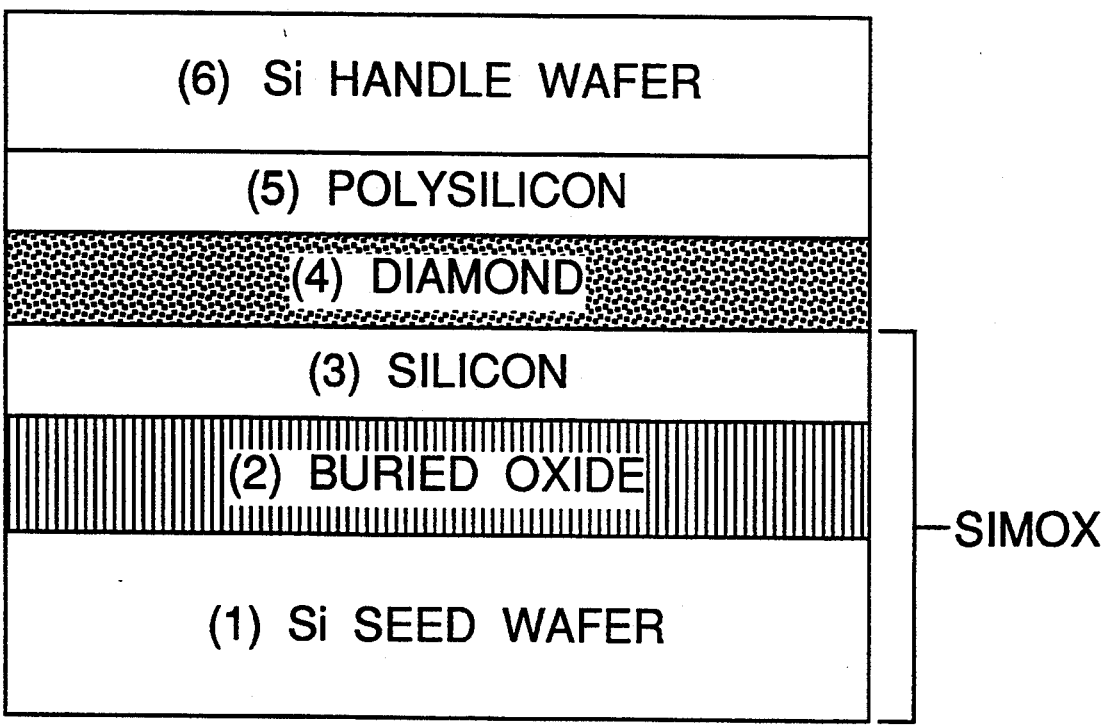

FIG. 2 is an illustration of a sequence of fabrication steps for a second process. In FIG. 2, we use a SIMOX wafer as our starting substrate. Here the buried oxide 2 is used as an etch stop layer. A CVD diamond film 4 is deposited on top of the silicon layer 3 of a standard SIMOX wafer. A thin polysilicon layer 5 is deposited on top of the diamond layer. This substrate with layers 1 through 5 is now bonded to a silicon handle wafer 6. Now silicon layer 1 of the bottom substrate is removed mostly by mechanical means and then by chemical etching. The buried silicon dioxide is also removed by chemical etching. The devices are fabricated in the thin silicon layer. Turning around the wafer the structure is silicon 6, polysilicon 5, diamond 4, and silicon layer 3. Silicon layer 3 can be the overlayer silicon left on top after implantation in the SIMOX process or the overlayer silicon plus any epitaxial silicon deposited over this layer after SIMOX process. The polysilicon layer can be eliminated when the technology is matured enough to bond the diamond film to the silicon directly.

As in the first process, modifications to the second process of FIG. 2 are possible. The removing steps can be done by mechanical means such as grinding and sandblasting with ice.

Figure 3:
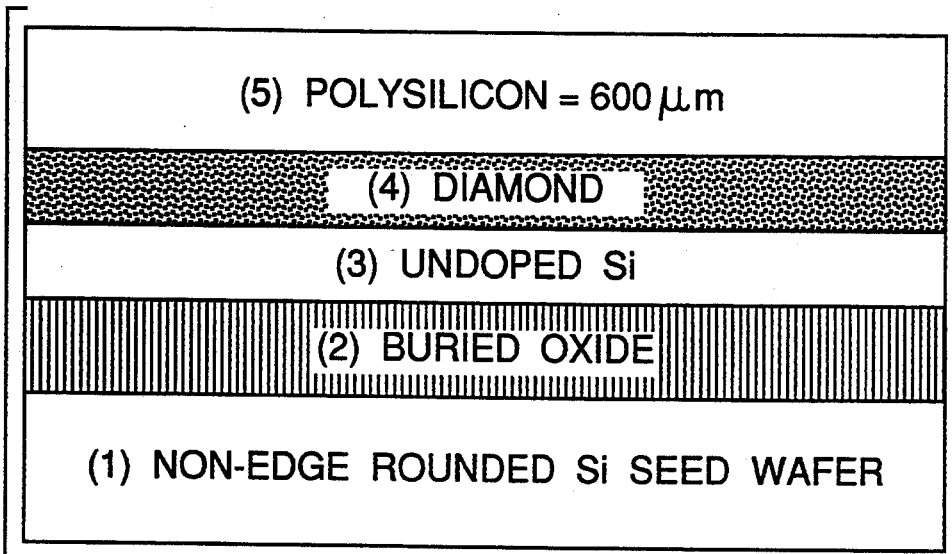
Figure 3:
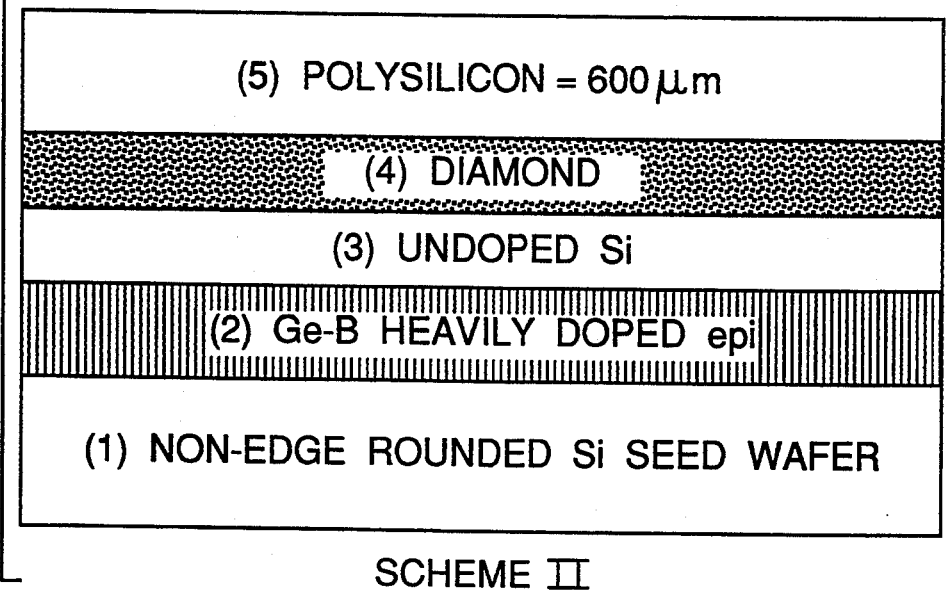

FIG. 3 is an illustration of a third process. In this approach we use either of the other two processes (scheme I or scheme II) to obtain the layers 1 through 4. But in this approach non-edge rounded silicon wafer is selected as the starting substrate for both the schemes I and II. On this structure now we deposit a polysilicon layer of a thickness greater than a standard wafer thickness 600 $\mu$m. This layer is quite thick and is used as the handle layer. The polysilicon layer is then slightly reduced to planarize the handle wafer. The non-edge rounded substrate is necessary to avoid warping of the substrate when a thick polysilicon layer is deposited. The non-edge rounded silicon layer 1 is mostly removed by mechanical means and chemical etching. The etch stop layer 2-B/Ge heavily doped layer in scheme I or the implanted buried oxide layer in scheme II is etched to expose the silicon layer where devices will be fabricated. The structure when turned around looks like this: A thick polysilicon handle layer 5, diamond layer 4, silicon device layer 3. This structure is dielectrically isolated SOD structure.

In all the schemes described above, various layer thicknesses are not restricted and so also the substrate diameters. The thicknesses of various layers and the substrate diameters are application dependent.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process for fabricating a silicon-on-diamond wafer, said process comprising the steps of:
    a growing step that includes growing an etch stop layer on a silicon seed wafer, and growing an undoped silicon layer on said etch stop layer;
    a depositing step that includes depositing a diamond layer on top of said undoped silicon layer, and depositing a polysilicon layer on top of said diamond layer;

a bonding step that entails bonding a silicon handle layer on top of said polysilicon layer; and a removing step of removing said etch stop layer and said silicon seed wafer to leave thereby said silicon-on-diamond wafer.

2. A process as defined in claim 1, wherein said removing step is accomplished using techniques that comprise: grinding, sandblasting, sanding, and chemical etching.

3. A process as defined in claim 1, wherein said growing step comprises growing said etch stop layer such that it is heavily doped with dopants that comprise germanium and boron.

4. A process for fabricating a silicon-on-diamond wafer, said process comprising the steps of:
   depositing a diamond layer onto a SIMOX seed wafer;
   depositing a polysilicon layer on top of said diamond layer to produce thereby a substrate;
   bonding the substrate to a silicon handle wafer;
   removing the SIMOX seed wafer minus the silicon overlayer on top of the buried oxide to yield thereby said silicon-on-diamond wafer.

5. A process, as defined in claim 4, wherein said removing step comprises removing layers with techniques that comprise: grinding, sandblasting with ice, and chemical etching.

* * * * *